April 6, 1971 J. S. DROTAR ET AL 3,573,973
HIGH SPEED ADDITIVE CIRCUIT PROCESS
Filed Nov. 13, 1967
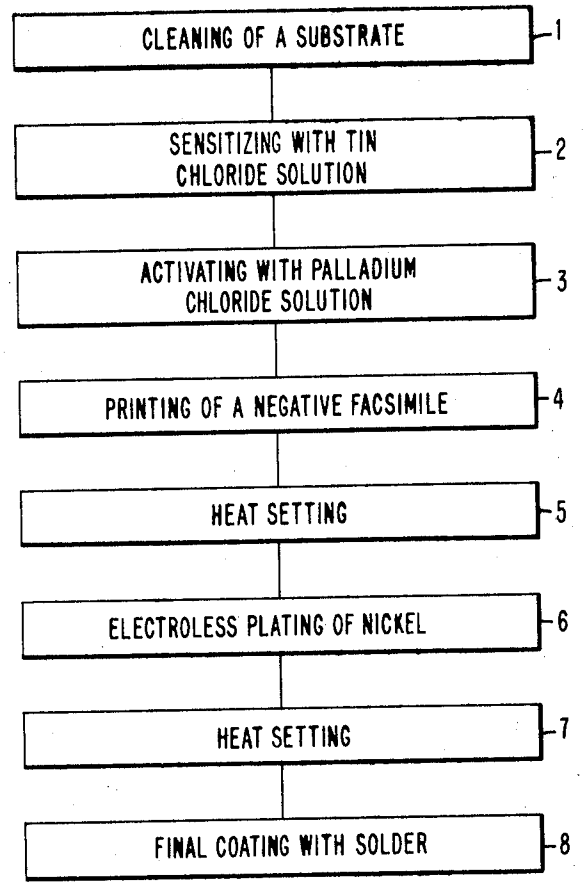
INVENTORS.
JOHN S. DROTAR
ARDEN PARKER
KEITH A. SNYDER
BY J. Tanin Jr.
ATTORNEY

United States Patent Office 3,573,973

Patented Apr. 6, 1971

3,573,973

HIGH SPEED ADDITIVE CIRCUIT PROCESS

John S. Drotar, Endicott, N.Y., Arden A. Parker, Hightstown, N.J., and Keith A. Snyder, Vestal, N.Y., assignors to International Business Machines Corporation, Armonk, N.Y.

Filed Nov. 13, 1967, Ser. No. 682,373
Int. Cl. H05k *1/00*
U.S. Cl. 117—212 5 Claims

ABSTRACT OF THE DISCLOSURE

A high speed additive circuit process for manufacture of circuit lines upon a polyester or polyimide substrate, including through-holes therein, comprising the steps of cleaning, sensitizing, activating, printing a negative facsimile, of the final desired pattern over the activated surface, heat setting, electroless nickel plating, curing, and final conductive coating by flow soldering. Only one step may exceed one minute in time. Temperatures and time at temperature details are included. Conductive lines as fine as 2 mils wide on 4 mil centers may be made by this process.

FIELD OF THE INVENTION

Processes for forming patterns, conductive layers, circuit configurations upon a conductive or non-conductive backing, such processes being essentially additive in nature, such as coating, electroless plating, electroplating, soldering, spraying, etc., including combinations of these processes in forming the intermediate or final product or article.

BACKGROUND OF THE INVENTION

Printed circuit boards are well known in the art. These boards include both rigid cards and flexible circuitry, usually a function of the thickness of the insulating substrate upon which the conductive circuitry is placed. The most common method of manufacture of these circuit boards is a process whereby a conductive layer, such as copper, is laminated to an insulating substrate, which may be an epoxy glass material, for example. The normal process for making printed circuit boards of this type includes the successive steps of laminating the conductive layer to the insulating layer, and placing the final circuit pattern upon the conductive layers through conventional photoresist and etching means. Alternatively, circuits may be manufactured by depositing upon the insulating substrate a conductive layer, by plating means, vacuum deposition, spraying, etc.; and then forming the circuit thereon by photoresist and etching methods, as above.

Another method of making such printed circuit cards comprises the steps of forming directly upon the insulating substrate surface the final desired conductive pattern, such as by spraying a conductive material through a mask, and then by plating or soldering means building this pattern to the final desired thickness. Conversely, the surface of the insulating substrate may be activated for an electroless plating deposition, and a photoresist material formed upon said surface by conventional photoresist means in the negative facsimile of the desired pattern. The exposed surface is then electrolessly plated to the desired final thickness, and the photoresist removed.

These methods all have certain disadvantages. The thinner the insulating material gets, such as for flexible circuitry, the more difficult it is to laminate solid copper sheets to the insulator, and to successfully photoresist and etch such flexible materials. Where such circuitry is to be added by plating methods, the same photoresist difficulties exist, as well as added difficulties in assuring good adhesion of the final conductive material to the insulating surface. In all cases, the difficulties are compounded when the final desired circuitry is of a very fine line nature, such as 4 mil lines on 8 mil centers, or 2 mil lines on 4 mil centers. Where it is desired to place conductive circuitry on opposed surfaces of the insulator, especially when these surfaces are to be interconnected via through-hole connectors, the difficulties are additionally compounded. Thus, where laminated circuitry is utilized, additional steps of through-hole interconnection processing, such as by electroless and electroplating methods, must be utilized. Where an additive electroplating or electroless plating process is utilized upon flexible circuitry, or even upon heavier circuitry, problems arise in making sure that the through-holes are not filled inadvertently with photoresist, so that through-hole connections will be made where desired.

In all of the above processes, a great deal of time must be expended in the manufacture of such circuit boards. This time, where laminated circuitry is used, is in the order of hours, from the laminating process itself. In the plating processes, it is usual for the time period to well exceed one hour, due to the necessary length of time often used in the plating steps. Where such times are required, such processes do not lend themselves to ready automation, as expensive equipment must be tied up for inordinate lengths of time in processing each step.

Thus it would appear desirable, especially in the manufacture of flexible circuitry, to have a high speed process that can be easily automated; where the circuit lines have good adhesion to the insulating substrate; where the conditions in the manufacturing process are easily controlled; where the process is economical; and where fine line definition of the final circuitry may be easily and readily achieved. Further, through-hole connections must be made whenever desirable at little or no additional cost in time or materials.

SUMMARY OF THE INVENTION

It is an object of this invention to decrease processing time in the manufacture of additive printed circuit boards by a high speed chemical process.

A further object of this invention is to increase the adhesion of additive circuitry upon circuit boards.

Still another object of this invention is to decrease process time in the manufacture of an additive printed circuit card by utilizing easily controlled conditions, economical materials, in an automated assembly.

Yet another object of this invention is to improve the quality of additive printed circuit cards to allow fine line circuitry to be placed thereon.

These and other problems of the prior art are overcome by the method of this invention. Briefly stated, the high speed additive circuit process of this invention comprises, on typical substrates such as polyester or polyimide, the steps of cleaning the surfaces to be coated in a chromic acid solution between 170°–180° F. for 15 seconds; further cleaning in a caustic sodium hydroxide bath at 170° F. for 10 seconds; rinsing with detergent, then plain water; sensitizing with a stannous chloride solution for 10 seconds; activating with a palladium chloride solution for 10 seconds; over-printing a negative facsimile of a final desired pattern, such as with a high speed printing press; heat setting between 140° to 160° F. for 30 seconds; electroless nickel plating to just form a continuous film of nickel, for example, for 30 seconds; curing in air for one minute at about ⅔ the softening point of the substrate (in ° F.); and final coating to a highly conductive surface by flow soldering, electroplating, etc. This high speed process, in which but one step may exceed one minute in time, concurrently produces a strong, adherent film, for thin strip line connectors, or conventional circuit boards. All surfaces, including through-hole connections, may be processed simultaneously in each step in an automated process. Completed assemblies may be made in a matter of minutes.

These and other objects of the invention will best be understood by reference to the accompanying drawing and the following description of the method of this invention.

THE DRAWING

The figure shows a flow diagram of the method of this invention.

GENERAL DESCRIPTION

We have found that by utilizing certain heating cycles in combination with modifications of known processes currently used in manufacturing additive printed circuitry, unexpected results are obtained that allow a very high speed additive circuit process to be utilized. This process simultaneously gives high speed, high adhesion, and fine line definition.

The process of our invention is shown in the steps that follow. These steps are shown in the flow diagram of the figure.

In step 1 (of the figure) an electrically insulating substrate is first thoroughly cleaned to prepare its surface for subsequent electroless plating. For example, we have used substrates of Mylar, a polyester, and of Kapton, a polyimide. Mylar and Kapton are registered trademarks of the E. I. du Pont Corporation. For flexible circuitry, these substrates are selected of a thickness approximately 1 to 3 mils thick. If the final circuitry requires through-hole interconnections between the conductive circuitry on one side of the substrate to the other side of the substrate, these through-holes should be punched into the sheet prior to cleaning and subsequent processing. Addition of through-holes later in the process would require repetition of certain steps.

The cleaning step should remove all dirt and grease upon the surfaces of the substrate, such that the surfaces will be receptive to subsequent plating operations. In our process, we have found a three-step cleaning process to be most desirable. The first step is to immerse the substrate in a chromic acid solution comprising materials in the proportions of 11.7 liters $H_2SO_4$, 3 liters $H_2O$, and 438 grams of sodium dichromate. This highly acidic solution is maintained at a preferred temperature of 170° F., although a range of 170° to 180° F. is acceptable. The preferred immersion time is 15 seconds, with a time greater than one minute rarely being necessary. It is clear of course, that should a lower temperature of the acid solution be utilized a longer time may be necessary to achieve the similar cleaning as that at the higher temperature.

After contacting the surfaces upon which the additive circuitry is to be placed with the chromic acid solution, these surfaces are rinsed in flowing water. The substrate is next immersed in a caustic bath comprising materials in the proportions of 45 liters $H_2O$, and 6300 grams of sodium hydroxide. A preferred temperature for this solution is substantially 170° F., with an immersion time between 10 and 30 seconds. It should not be necessary to contact the substrate surfaces with this solution for greater than one minute. As with the acid bath, a lower temperature may require a longer time.

If the polyester substrate is used, it may now be rinsed in plain water. If the polyimide substrate is used, it is best to rinse initially in a mild detergent solution, to remove any adherent film redepositioned from the caustic bath, and then rinse in plain water. It is known that the chromic acid solution will etch polyester material, and that the caustic bath will etch polyimide material. Best results have been found, however, when the materials utilized have been cleaned through the baths in the succession listed.

The substrates, after rinsing from the caustic bath, need not be dried, but in step 2, may be immediately immersed in a tin chloride sensitizer solution, comprising materials of the proportions of 45 liters $H_2O$, 670 grams $SnCl_2 \cdot 2H_2O$, and 775 grams $SnCl_4$ (anhydrous). This bath is operated at a temperature substantially 70 to 80° F., or usual room temperature, with an immersion time of 10 to 30 seconds. This bath will deposit a film of tin chloride upon the surface of the substrate. If the substrate contains through-holes, the internal surfaces of the through-holes will, of course, also be so coated. The substrate is then rinsed with plain water.

The substrate, in step 3, is then immersed in a palladium chloride activator solution comprising materials in the proportion of 45 liters water, about 100–250 grams of $PdCl_2$, brought to a pH of approximately 1.0 with hydrochloric acid. This bath is operated at a temperature of between 70 to 80° F., or again, substantially room temperature, with an immersion time of at least 10 seconds. Longer immersion times in this bath do not seem to affect the final results. Immersion in this bath will deposit a film of metallic palladium upon the tin chloride film through reduction of palladium chloride by the $SnCl_2$. The substrate is then removed from the solution and rinsed in plain water.

To avoid damage to the surfaces, it is, of course, important to avoid contacting said surfaces with fingers, clips, etc.

It is now necessary to dry the surfaces of the substrate so that printing, to be done in a subsequent step, will adhere to the surface. Thus the water from the previous rinse may be removed from the substrate in air at a temperature between 70 and 160° F., for best results. Depending upon how much water remains upon the surface, this step may exceed 1 minute in time. The use of an air-knife to remove excess water prior to drying will accelerate the drying step.

After the substrate is dried, a negative facsimile of the final desired conductor pattern is deposited upon the surface of the substrate, as shown in step 4. This deposited material is preferably pin-hole free, insoluble in water, electrically non-conducting, and preferably, though not necessarily, capable of fine line resolution, and molten-solder resistant. The printing may be done on, for example, a flat bed press, where one side printing is desired; or using a rotary offset letter press machine where printing on both sides at the same time is desired.

For ultimate fine line resolution with a coating that is solder resistant, we prefer to use a coating comprising a high melting point, high solubility synthetic ester resin, such as Husen Company's WH–1900, having an acid value of 10–20, and a melting point of 180–190° C., mixed in a high boiling point aliphatic hydrocarbon oil, with a boiling point of about 520° F. A preferred oil is Magie 520 oil, a product of Magie Bros. The solution comprises approximately 40% resin, with a viscosity between 62–98.5 poise. The coating may be applied with a Vandercook Proof Press, although other means are available.

After the coating has been deposited, the coating should be heat set, as shown in step 5, at a temperature between 140 and 160° F., preferably at 150° F., for substantially 30 seconds, in an atmosphere of preferably less than 50% relative humidity. In the ink industry, heat set refers to evaporation of the solvent, thus forming a continuous film, and does not indicate any chemical cross-linking or bonding. This heat set appears to dry the ink at a temperature below that at which the ink will migrate. Migration is clearly undesirable, as it will obscure the printed pattern. As the relative humidity increases, a longer drying time is necessary. However, best results were obtained at the time, temperature, and relative humidity percentages above.

After the coating is dried, the substrate, in step 6, is placed in an electroless plating bath that will deposit a metal upon the palladium metallic surface exposed through the negative facsimile coating. The substrate should be immersed in the bath for a time just necessary to place a continuous coating of the metal upon the exposed surface. While many conventional electroless plating baths may be utilized, most notably copper and nickel, we have found it preferable to use a nickel plating bath known as the Kanigen process. Kanigen is a registered trademark of the American Transporation Corporation. This bath comprises materials in the proportion of 45 liters water, 715 grams $NiSO_4 \cdot 7H_2O$, 1070 grams $NaH_2PO_2H_2O$, 1390 grams lactic acid 85%, 214 grams sodium acetate, 724 grams sodium succinate, 161 grams acetic acid, 2 to 3 parts per million lead acetate, with sodium hydroxide solution or sulfuric acid solution added to adjust the pH to preferably 5.2, although a range between 4.8 and 5.6 has been found acceptable. This bath should be maintained in the temperature range between 170 and 190° F., with an immersion time of substantially 30 seconds. At temperatures less than 170° F., the time necessary to deposit such a coating increases, and is thus not desirable. After such immersion, the substrate is rinsed with water, and dried to remove any residual rinse solution.

Thus, in the example above, the final desired circuit is thus established in a solderable metal on both sides of the substrate with holes being plated through if the substrate was punched or drilled prior to the first step of this process.

The printed coating may optionally be removed at this step in the process, by contacting the coating with a solvent that will loosen or dissolve the coating, but leave unaffected the substrate and the additive materials.

The final step is to prepare the circuit for a process that will reduce the electrical resistance. In general, the substrate, having the electroless deposited metal thereon, is, in step 7, heated in air for approximately 1 minute at approximately ⅔ the softening point of the substrate (in ° F.) material. For polyimide material having a softening point of approximately 600° F., a preferred temperature is 380° F. For polyester material having a softening point of approximately 300° F., a preferred temperature is approximately 200° F. This step appears to increase the adhesion of the final conductive coating upon the insulating substrate.

The increase in resistance of the final circuit pattern is now lowered by addition, in step 8, of a second metallic coating upon the first metallic coating placed on the circuit pattern by electroless plating, such as the nickel above. The preferred method is to flux the surfaces of the substrate with a conventional solder flux, and then using flow soldering techniques, coat the circuit pattern upon the substrate. Thick solder layers, up to and thicker than 5 mils, depending upon line width, may be deposited upon the circuit in this manner. Alternatively, another method which is more expensive and slower is to build up the plating thickness by electroless copper plating and electrolytic copper plating over the initial nickel plating. Or, a combination of methods may be used, in which a thin layer of solder is initially placed upon the initial nickel coating, followed by copper plating, or gold plating, etc.

If the electrically non-conductive coating has not been removed prior to these final steps, it may now be removed.

Thus, reviewing the process, the only step that may require a time greater than one minute is that step wherein the surfaces of the substrate are dried after being contacted with the palladium chloride solution. However, depending upon the amount of rinse solution remaining upon the surface of the substrate, and the temperature utilized, this step may also be carried out in less than one minute. Every other step in this process may be carried out in less than one minute. Thus, it is evident that a high speed process has been developed which is readily lendable towards automation, as no equipment is tied up for any great length of time during any one step. Further, the negative facsimile, in an electrically non-conductive coating, may be applied by a rotary offset press, which has a very high rate of output. Fine lines may be printed by conventional printing means, such as by the flat bed press, which have allowed lines as fine as 2 mils wide on 4 mils centers to be printed continually on a thin insulating substrate of both polyimide and polyester materials.

Through-holes have also been successfully connected between circuit surfaces utilizing this technique.

Utilizing an adhesion test whereby one inch wide strips of the insulating materials have been completely coated with solder by this process, and then soldered to each other, the insulating material then pulled from the back of the connection, the following adhesion results, in pounds, have been found; on polyimide, greater than 5 pounds was necessary to separate the film from the coating. On polyester, greater than 4 pounds of force was needed to separate the coating. It is interesting to note that without the detergent rinse in the initial cleaning process, the polyimide pattern adhesion was approximately 2½ pounds, compared to the final result of over 5 pounds when detergent was used.

In summary, the manufacture of additive printed circuit boards by the process of this invention has the following advantages over the prior art: (1) it is a high speed process, readily lendable to complete automation; (2) the process is economical because the materials utilized are readily available; (3) temperatures involved and the materials utilized are easily controllable; (4) the use of printing technology well known in the art allows very fine line resolution to be achieved; and (5) the final conductive circuitry is highly adhesive to the electrically insulating substrate upon which it is adhered.

Where other materials other than polyester or polyimide are used, it is clear that certain steps will have to be altered accordingly. Further, while we have discussed our process in terms of the manufacture of flexible printed circuitry, it is clear that should an insulating substrate of substantial thickness be used so as not to meet the general definition of flexibility, this process is equally as effective.

While the invention has been particularly shown and described with reference to the preferred embodiments thereof, it will be understood by those skilled in the art that various changes in form and details may be made therein without departing from the spirit and scope of the invention.

What is claimed is:

1. A method of forming a conductive layer upon an insulating substrate comprising the steps of:
cleaning at least one surface of said substrate;
depositing a film of stannous chloride upon said surface by contacting said surface with a tin chloride solution for substantially 10 seconds at a temperature of substantially 70°–80° F. and then rinsing said surface;
depositing a film of metallic palladium upon said surface by contacting said film of stannous chloride with an acidic palladium chloride solution for at least 10 seconds at a temperature substantially 70°–80° F. and then rinsing said surface;
drying said surface for a length of time and at a temperature sufficient to remove any residual rinse solution, said temperature below the softening temperature of said substrate;
depositing upon said surface an electrically non-conducting coating in the negative facsimile of the desired conductive layer;
heat-setting said coating at a temperature sufficient to dry said coating and less than that sufficient to cause migration of said coating, said temperature below the softening point of said substrate;
depositing a first metallic coating upon said metallic palladium where said palladium is exposed through said negative-facsimile coating by contacting said surface with an electroless plating solution capable of depositing a metallic film upon said palladium, for a length of time and at a temperature just sufficient to deposit a coating of said metallic film upon said surface, then rinsing said surface;

heating said substrate for at least one minute at a temperature substantially two-thirds the softening temperature of said substrate (all in ° F.);

depositing a second metallic coating upon said first metallic coating, to a thickness greater than said first coating; and removing said electrically non-conductive coating;

thus forming a conductive layer upon said insulating substrate.

2. The method of claim 1 wherein said substrate is a polyimide material.

3. The method of claim 1 wherein said substrate is a polyester material.

4. The method of claim 1 wherein said substrate is a polyimide and said cleaning step comprises contacting said surface with a chromic acid solution comprising materials in the proportions of 11.7 liters $H_2SO_4$, 3 liters water, 438 grams sodium dichromate, at a temperature between 170–180° F., for a time between 15 and 60 seconds, and rinsing said surface with water; contacting said surface with a caustic bath comprising materials in the proportions of 45 liters $H_2O$, 6300 grams NaOH, at a temperature of substantially 170° F. for a time between 10–60 seconds; rinsing said surface in a detergent solution; and rinsing said surface with water.

5. The method of claim 1 wherein the step of depositing a second metallic coating includes depositing the coating directly on said first metallic coating by steps comprising solder fluxing said first metallic coating, and flow soldering a thin coating of solder directly upon said first metallic coating.

References Cited

UNITED STATES PATENTS

| | | | |
|---|---|---|---|
| 3,537,507 | 4/1969 | Jensen | 117—47X |
| 3,244,553 | 4/1966 | Knapp et al. | 117—46X |
| 1,582,668 | 4/1926 | Dreifuss | 117—46 |
| 3,415,679 | 10/1968 | Chuss | 117—212 |
| 3,269,861 | 8/1966 | Schneble et al. | 117—213X |
| 3,245,826 | 4/1966 | Luce et al. | 117—47X |
| 3,212,918 | 10/1965 | Tsu et al. | 117—47X |
| 3,135,638 | 6/1964 | Cheney et al. | 96—36.2X |
| 3,115,423 | 12/1963 | Ashworth | 117—212 |
| 3,035,916 | 5/1962 | Heiart | 117—47X |
| 3,006,819 | 10/1961 | Wilson et al. | 117—212X |

ALFRED L. LEAVITT, Primary Examiner

A. GRIMALDI, Assistant Examiner

U.S. Cl. X.R.

96—36.2; 117—47, 213